United States Patent [19]

Hiramoto et al.

[11] Patent Number: 4,816,293
[45] Date of Patent: Mar. 28, 1989

[54] PROCESS FOR COATING A WORKPIECE WITH A CERAMIC MATERIAL

[75] Inventors: Seigou Hiramoto; Osamu Hamada; Takeshi Morita; Megumi Ohmine, all of Amagasaki, Japan

[73] Assignee: Mitsubishi Denki Kabushiki Kaisha, Japan

[21] Appl. No.: 29,543

[22] Filed: Mar. 24, 1987

[30] Foreign Application Priority Data

Mar. 27, 1986 [JP] Japan ................................. 61-68931
Apr. 7, 1986 [JP] Japan ................................. 61-81462

[51] Int. Cl.4 ............................................... B05D 3/06
[52] U.S. Cl. ....................................... 427/53.1; 427/35
[58] Field of Search .............................. 427/53.1, 35

[56] References Cited

U.S. PATENT DOCUMENTS

| 3,756,193 | 9/1973 | Carmichael et al. | 118/49.1 |
| 4,153,005 | 5/1979 | Norton et al. | 118/49.1 |
| 4,177,093 | 12/1979 | Feng et al. | 427/35 |
| 4,248,909 | 2/1981 | Whittaker | 427/53.1 |
| 4,427,723 | 1/1984 | Swain | 427/53.1 |
| 4,537,791 | 8/1985 | Tarjan | 427/53.1 |
| 4,592,923 | 6/1986 | Kadono et al. | 427/35 |

FOREIGN PATENT DOCUMENTS

| 0055328 | 7/1982 | European Pat. Off. |
| 59-116373 | 7/1984 | Japan . |
| 1037675 | 4/1963 | United Kingdom . |
| 1074872 | 7/1967 | United Kingdom . |
| 1094747 | 12/1967 | United Kingdom . |
| 1116857 | 6/1968 | United Kingdom . |
| 1234312 | 6/1971 | United Kingdom . |
| 1392583 | 4/1975 | United Kingdom . |

Primary Examiner—Norman Morgenstern
Assistant Examiner—M. L. Padgett
Attorney, Agent, or Firm—Leydig, Voit & Mayer

[57] ABSTRACT

A process for coating a workpiece with a ceramic material comprising the steps of axially advancing a cylindrical ceramic rod of a ceramic material relative to a workpiece while rotating it about its axis in a vacuum, to feed the ceramic rod into an energy beam for evaporation. The rate of feeding of the ceramic rod depends on the rate of deposition of the evaporated ceramic material on the workpiece.

8 Claims, 4 Drawing Sheets

PROCESS FOR COATING A WORKPIECE WITH A CERAMIC MATERIAL

BACKGROUND OF THE INVENTION

This invention relates to a process and an apparatus for coating a workpiece with a ceramic material and more particularly, to a process and an apparatus for coating a workpiece such as a machine component with a ceramic material using an energy beam such as an industrial laser, a $CO_2$ laser or an electron beam as a heat source.

It is well known to form a coating of a ceramic material such as alumina, silicon nitride, and the like on a surface of a workpiece such as a machine component including a gear, a shaft, or a measuring sensor. By the use of this ceramic coating, many characteristics such as heat resistance, corrosion resistance, resistance to wear, and the like can be improved.

FIG. 1 is a schematic view showing a conventional apparatus for ceramic coating using a laser which is disclosed, for example, in Japanese Laid-Open 59-116373. In FIG. 1, a workpiece such as a substrate 1 and a ceramic material 2 are supported in a vacuum chamber 3, with a predetermined distance between the substrate 1 and the ceramic material 2. The vacuum chamber 3 is maintained at about $10^{-4}$ torr. A laser oscillator 4 such as a $CO_2$ laser oscillator is disposed near the vacuum chamber 3 and generates a laser beam 5. The laser beam 5 generated is guided to a condenser lens 6 using mirrors 7, 8, and 9, where the laser beam 5 is appropriately condensed. Then, the condensed laser beam 5 irradiates the ceramic material 2 supported in a vacuum chamber 3 through a window 10. When the irradiated surface of the ceramic material 2 is heated by the laser beam 5 to reach the evaporation temperature of the ceramic material 2, a part of the ceramic material 2 evaporates to form particulates 11 thereof. The particulates 11 formed are then deposited on a substrate 1 to form a very thin coating of the ceramic material 2 thereon. Heaters 12 and 13 are also installed in the vacuum chamber 3 in order to increase the adhesion strength of the deposited coating of the ceramic material 2 and to stabilize the deposition condition thereof.

When desired, a plurality of coatings of the ceramic materials can also be formed on a single substrate one upon another. In this case, a plurality of ceramic materials and a plurality of heaters are provided in the vacuum chamber and the laser beam is irradiated in turn on the ceramic materials to form a plurality of coating layers of the ceramic materials on the substrate.

In the conventional process for coating a workpiece with a ceramic material, particularly, with a plurality of coatings of ceramic materials, the ceramic materials to be irradiated by a laser beam are provided in the shape of disks or cylinders, and the surface of the ceramic material is consumed as the evaporation progresses so that the position on the ceramic material at which the material is irradiated by the laser beam is altered momentarily, making it difficult to maintain evaporation conditions stable during the operation. Therefore, the thickness of the coating layer is not uniform or large particles of the ceramic material are scattered from the ceramic material 2, and a stable coating cannot be achieved. In addition, due to the requirement for the heating sources such as heaters for each ceramic material, the structure and the operation of the coating apparatus is complicated and a large operating space for coating is needed.

SUMMARY OF THE INVENTION

Accordingly, an object of the present invention is to provide a process for coating a workpiece with a ceramic material in which evaporating conditions are always stable, and a high quality ceramic coating of uniform thickness can be obtained.

Another object of the present invention is to provide an apparatus for coating a workpiece with a ceramic material in which a large operating space is not required and the apparatus can be operated with ease.

In order to achieve the above objects, the process for coating a workpiece with a ceramic material according to the present invention comprises the steps of irradiating an energy beam such as a laser beam on a tip of a cylindrical rod of a ceramic material in a vacuum so that the ceramic material is evaporated and deposited on a workpiece supported in the vacuum at a predetermined distance from the ceramic rod. The ceramic rod is, while being rotated about its axis, axially advanced to be fed into the energy beam, and the rate of feeding of the ceramic rod depends on the rate of deposition of the evaporated ceramic material on the workpiece.

According to another aspect of the present invention, there is provided an apparatus for coating a workpiece with a ceramic material comprising: means for defining a vacuum chamber; means for supporting a workpiece in the vacuum chamber; support means for movably supporting a cylindrical ceramic rod of a ceramic material in the vacuum chamber, in order to maintain a tip of the ceramic rod at a predetermined distance from the workpiece; a laser beam source for irradiating an energy beam on the tip of the ceramic rod to evaporate the ceramic material therefrom, thereby causing the evaporated ceramic material to deposit on the workpiece; drive means for axially advancing the ceramic rod, while rotating the ceramic rod about its axis, to feed the ceramic rod into the energy beam for evaporation of the ceramic material; and control means for controlling the rate of feeding of the ceramic rod in accordance with the rate of deposition of the evaporated material on the workpiece.

BRIEF DESCRIPTION OF THE DRAWINGS

The present invention will become more readily apparent from the following detailed description of the preferred embodiments of the invention taken in conjunction with the accompanying drawings, in which:

FIG. 4b is a plan view of the mechanism shown in FIG. 4a;

DESCRIPTION OF THE PREFERRED EMBODIMENTS

Figure 1:
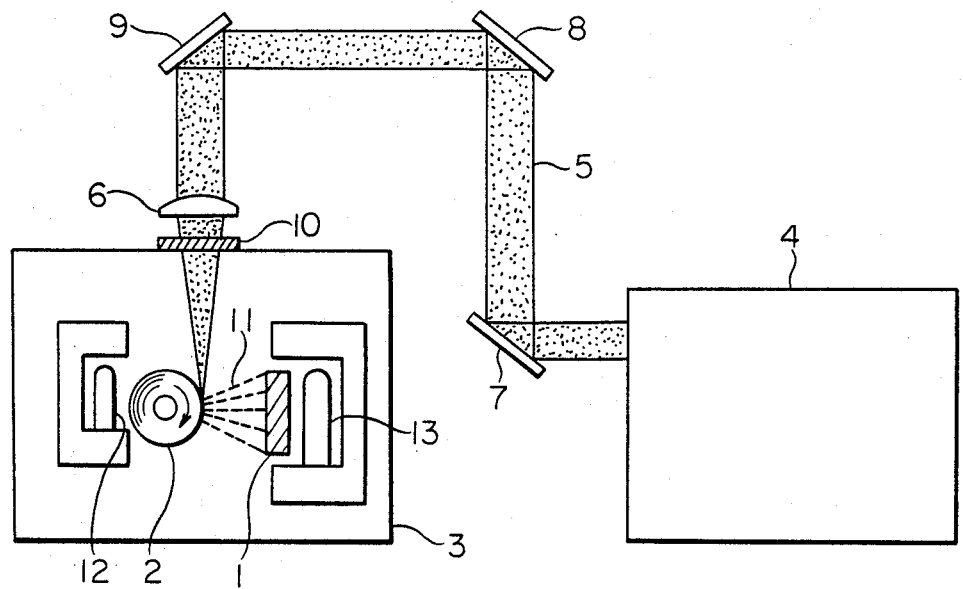
FIG. 1 is a schematic view showing a conventional apparatus for coating a workpiece with a ceramic material.
Figure 2:
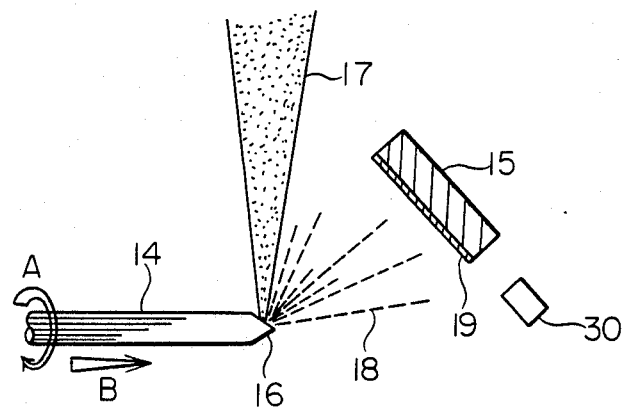
FIG. 2 is a schematic view showing the principal portion of one embodiment of a process or an apparatus for coating a workpiece with a ceramic material in accordance with the present invention.

In FIG. 2, a cylindrical ceramic rod 14 of a ceramic material and a workpiece such as a substrate 15 on which the ceramic material is to be deposited are supported in a vacuum chamber (not shown). The ceramic rod 14 has a tip 16 to which a laser beam 17 is irradiated at a predetermined distance from the substrate 15. The laser beam 17, which is generated by a laser oscillator such as a $CO_2$ laser oscillator (not shown) in the same manner shown in FIG. 1, is condensed by a condenser lens (not shown) and then introduced into the vacuum chamber through a window (not shown). The introduced laser beam 17 irradiates on the tip 16 of the ceramic rod 14 to evaporate the ceramic material therefrom forming particulates 18, thereby causing the particulates 18 to deposit on the substrate 15 to form a thin layer, that is, ceramic coating 19 thereon.

According to the present invention, the ceramic rod 14 is advanced axially as shown by arrow B in FIG. 2 while being rotated about its axis as shown by arrow A in FIG. 2, to feed the tip 16 of the ceramic rod 14 into the laser beam 17, in order to insure that the evaporation of the ceramic material from the tip 16 of the ceramic rod 14 is uniform. The rate of feeding of the ceramic rod 14 depends on the rate of deposition of the evaporated ceramic material on the substrate 15 as will be described in more detail later.

Figure 3:
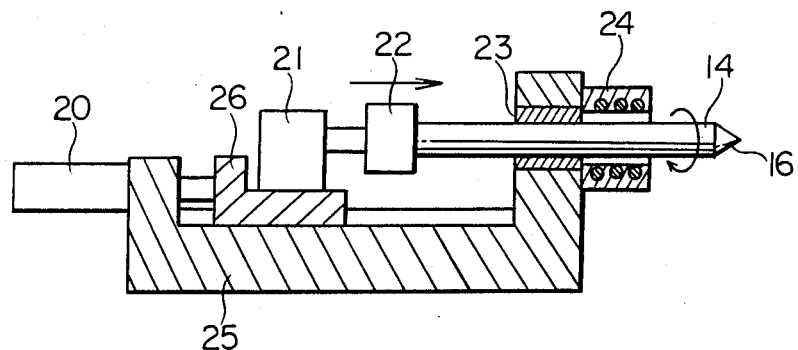
FIG. 3 is a side view showing a mechanism for axially advancing and rotating a ceramic rod.

FIG. 3 is a side view showing a mechanism for advancing and rotating the cylindrical ceramic rod 14. In FIG. 3, an air cylinder 20 is used for advancing the ceramic rod 14, and a motor 21 for rotating the same. The end portion of the ceramic rod 14 is supported by a holder 22 which is connected to the motor 21 for rotating the ceramic rod 14. The ceramic rod 14 is also supported near the center portion thereof by a guide bush 23. The holder 22 and the guide bush 23 are composed of a heat insulating material. A heater unit 24 is provided on the outside of the angled portion at one end of a trestle 25, and the heater unit 24 is disposed near the tip 16 of the ceramic rod 14 for heating areas near the tip 16 on which the laser beam 17 is to be irradiated. The guide bush 23 is provided in the angled portion of the trestle 25 to be in contact with the heater unit 24. On the other angled portion of the end of the trestle 25 the air cylinder 20 is provided for axially advancing the ceramic rod 14. The air cylinder 20 is connected at its plunger to a slider 26 on which the motor 21 is mounted. When the air cylinder 20 advances the slider 26, the ceramic rod 14 and the motor 21 are also advanced axially, and the ceramic rod 14 can be rotated about its axis by the motor 21.

The air cylinder 20 may be replaced with a hydraulic cylinder or a motor cylinder in which the rotational motion of a motor is translated into a linear motion. While the ceramic rod 14 is shown directly coupled to the rotating motor 21, a gear may be connected therebetween. Further, by using a small sized motor or cylinder, miniaturization of the apparatus can be easily achieved.

Figure 4A:
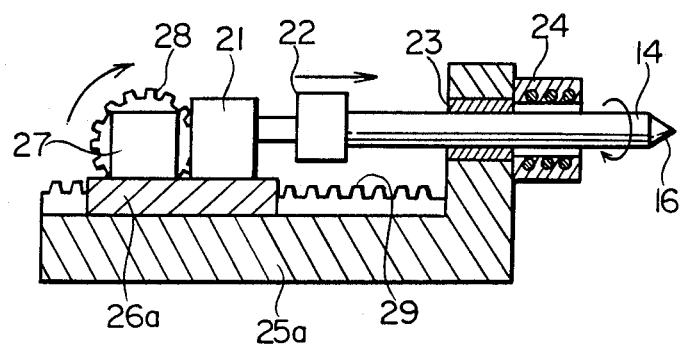
FIG. 4a is a side view similar to that of FIG. 3 and illustrating a mechanism for axially advancing and rotating the ceramic rod.
Figure 4B:
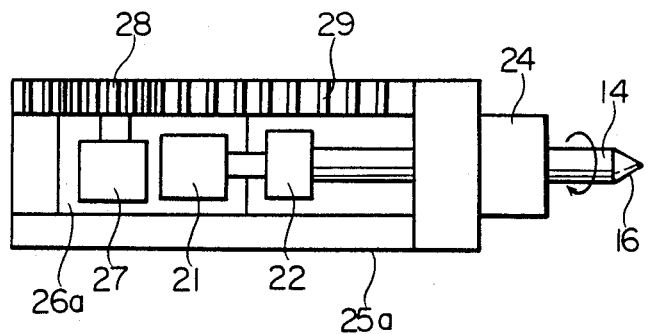

FIGS. 4A and 4B are a side view and a plan view, respectively, showing a mechanism of advancing and rotating the cylindrical ceramic rod 14 by motors. In FIGS. 4A and 4B, the rotating and advancing of the ceramic rod 14 are achieved by the rotating motor 21 and an advancing motor 27, respectively. The end portion of the ceramic rod 14 is supported by the holder 22, in the same manner shown in FIG. 3, which is connected to the motor 21 for rotating the ceramic rod 14. The ceramic rod 14 is also supported near the center portion thereof by the guide bush 23. The holder 22 and the guide bush 23 are composed of a heat insulating material. A heater unit 24 is provided on the outside of the angled portion at one end of a trestle 25a, and the heater unit 24 is disposed near the tip 16 of the ceramic rod 14 for heating the areas near the tip 16 on which the laser beam 17 is irradiated. The guide bush 23 is provided in the angled portion of the trestle 25a to be in contact with the heater unit 24. The advancing motor 27 is provided on a movable slider 26a for advancing the ceramic rod 14 and the motor 21 axially by means of a pinion 28 attached on the shaft of the advancing motor 27 and a rack 29 which is engaged by the pinion 28.

Figure 5:
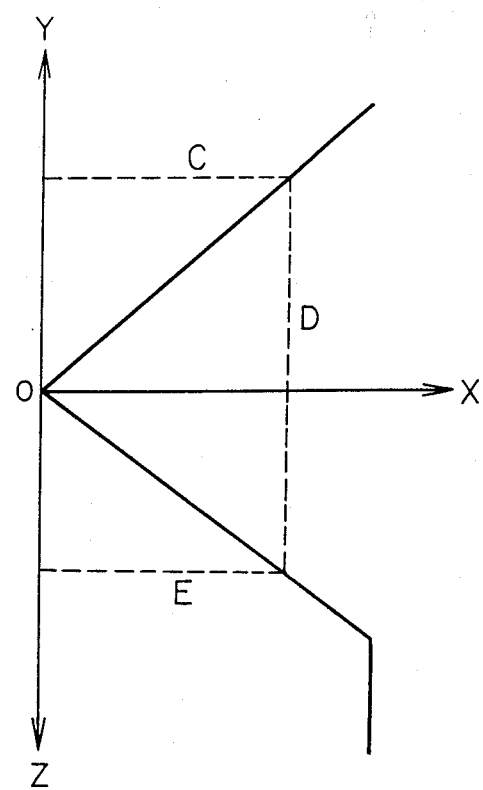
FIG. 5 is a diagram showing a relationship among a growth rate of a ceramic layer, an evaporative volume of the ceramic rod, and a feeding volume of the ceramic rod.

FIG. 5 is a diagram showing a relationship among an evaporation rate of the ceramic rod (X axis), a growth rate of the ceramic layer (Y axis), and a feed rate of the ceramic rod (Z axis). In FIG. 5, a dotted line C represents the growth rate of the ceramic layer under appropriate processing conditions, a dotted line D the evaporation rate of the ceramic material corresponding to the growth rate depicted by the dotted line C, and a dotted line E represents the feed rate of the ceramic rod according to the evaporation rate of the ceramic material. Since there is an upper limit in the evaporation rate of the ceramic rod even when the feed rate of the ceramic rod is increased, the upper limit of the appropriate feeding of the ceramic rod is determined experimentally in accordance with laser power and rotational speed of the ceramic rod. In order to feed the ceramic rod in accordance with the evaporation rate of the ceramic material, the feed rate of the ceramic rod is controlled to be equivalent to the growth rate of the ceramic layer which is determined experimentally by monitoring. This is because the growth rate of the ceramic layer directly corresponds to the feed rate of the ceramic rod through the evaporation rate of the ceramic material, as is shown in FIG. 5. As a monitor device for the thickness of the ceramic layer, for example, a quartz type thickness meter 30 (FIG. 2) can be utilized. The thickness meter 30 is positioned near the substrate 15 for monitoring the change in thickness of the ceramic layer deposited on the substrate 15, and the growth rate of the ceramic layer can be calculated.

According to the present invention, since the cylindrical ceramic rod is advanced axially while being rotated about its axis, to feed the ceramic rod into the laser beam for evaporation, the evaporation conditions can be kept stable, whereby a high quality ceramic coating having a uniform thickness can be obtained without an accompanying scattering of large particulates of the ceramic material.

Figure 6:
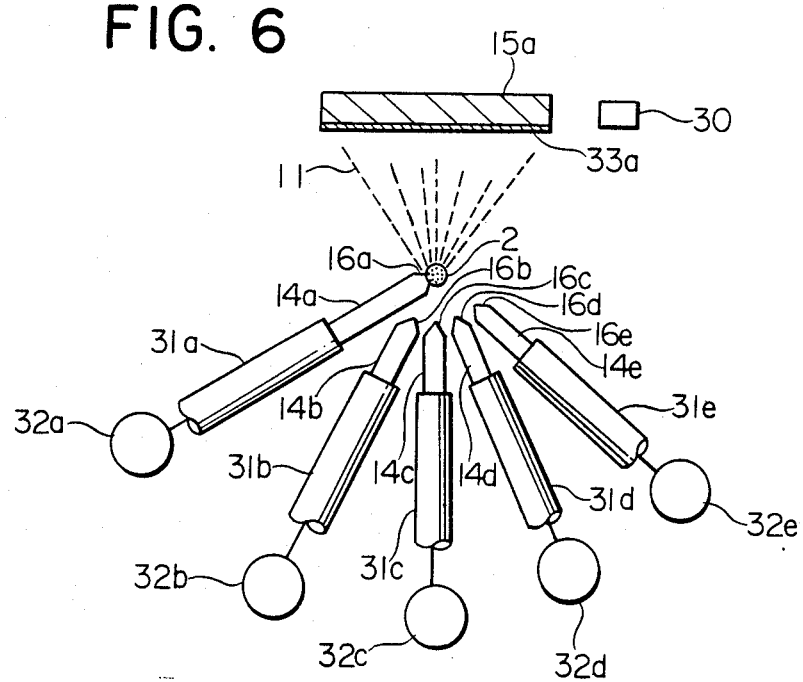
FIG. 6 is a fragmentary plan view showing the principal portion of the other embodiment of a process or an apparatus for coating a workpiece with a ceramic material according to the present invention.
Figure 7:
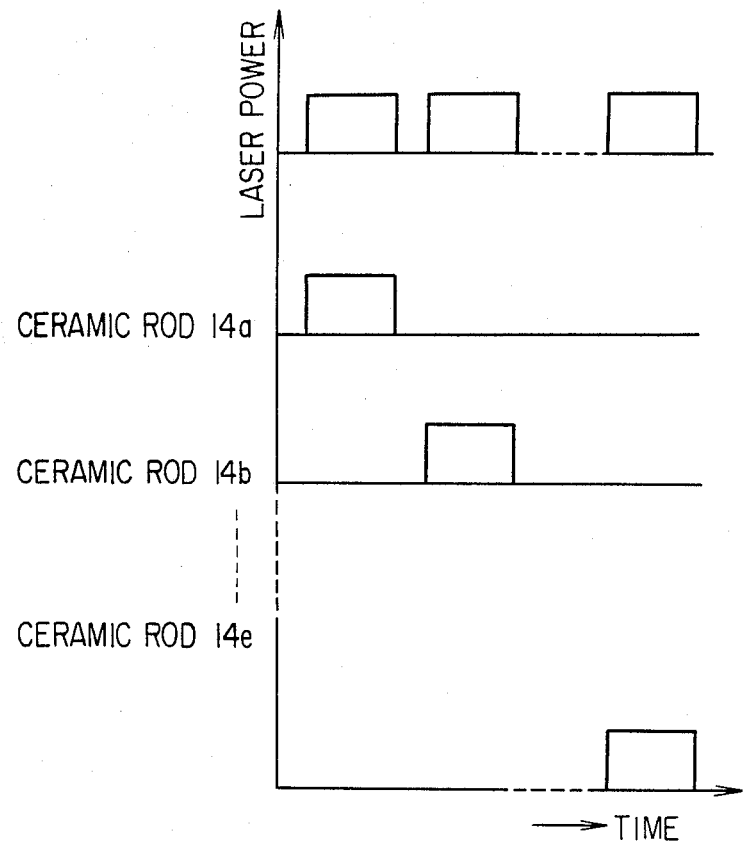
FIG. 7 is a diagram showing a change in laser power with time.
Figure 8:
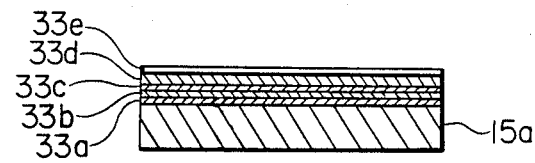
FIG. 8 is a sectional view of the substrate on which a plurality of ceramic layers are deposited in accordance with another embodiment of the present invention.

FIG. 6 is a fragmentary plan view showing the principal portion of another embodiment of the apparatus for coating a workpiece with a ceramic material according to the present invention. In FIG. 6, a plurality of ceramic rods 14a to 14e are mounted in the vacuum chamber (not shown) for forming a plurality of layers of the ceramic materials on the workpiece such as a substrate 1a. Each of the ceramic rods 14a to 14e have the same configuration as the ceramic rod 14 as shown in FIG. 2. That is, each of the ceramic rods 14a to 14e have tips (16a to 16e) to which the laser beam 5 is irradiated, at a predetermined distance from the substrate 1a. The ceramic rods 14a to 14e are different in ceramic material and are extended radially about the laser beam 5 in a plane perpendicular to the laser beam 5. The ceramic rod 14a is supported by a holder 31a which is driven by a feeding device 32a for feeding the ceramic rod 14a into the laser beam 5. Other ceramic rods 14b to 14e are also supported by holders 31b to 31e, respectively, which are driven by feeding devices 32b to 32e, respectively. The holders 31a to 31e and the feeding devices 32a to 32e, may be the same as the devices such as shown in FIGS. 3, 4A, and 4B. In order to feed each of the ceramic rods in accordance with the amount of evaporation of each of the ceramic rods, a monitoring device such as a thickness meter 30 shown in FIG. 6 may be used. The ceramic rods 14a to 14e are fed selectively in such a manner that the ceramic rods are fed one at a time to the laser beam 5. The laser beam 5 may be generated in the same manner as shown in FIG. 2. The irradiation of the laser beam 5 can correspond to a supplying condition of the laser powers as shown in FIG. 7. Accordingly, a plurality of layers 33a to 33e of ceramic materials corresponding to the ceramic rods 14a to 14e can be formed on the substrate 15b as shown in FIG. 8. To achieve an effective coating, for example, the ceramic material for the first ceramic layer 33a may be selected to have a good affinity to the substrate 15a, and the second, third, and following ceramic materials for the second ceramic layer 33b, the third ceramic layer 33c, and any following ceramic layers, respectively, may also be selected to have affinities thereof which are successively inferior. Consequently, a plurality of layers of ceramic materials having high quality and superior adhesion characteristics to the substrate can be obtained. For example, carbon steel for the substrate 15a, $ZrO_2$ for the first layer 33a, SiC for the second layer 33b, and $Si_3N_4$ for the third layer 33c may be selected. In this selection, since the coefficients of linear expansion of adjacent ceramic materials are only slightly different from each other, the low value of coefficients of linear expansion particular to the ceramic materials can be relaxed, making it possible to obtain the strong layers of the ceramic materials.

In the above-described embodiments, the $CO_2$ laser beam is used as an energy beam, however, other lasers such as a YAG laser or a high density heat source such as an electron beam can also be used. Although five cylindrical ceramic rods were used, any other number of ceramic rods may also be employed. The plurality of ceramic rods used need not be expanded radially, as any other arrangement is also possible. Further, even though the heater units were provided on each ceramic rod, instead of this plurality of heater units only one heater may be provided near the tips of the ceramic rods.

What is claimed is:

1. A process for coating a workpiece with a ceramic material comprising the steps of:
    supporting the workpiece in a vacuum;
    supporting a cylindrical rod of ceramic material in said vacuum, said rod having a tip at a predetermined distance from the workpiece;
    irradiating an energy beam on said tip of said workpiece to evaporate ceramic material therefrom, thereby causing said evaporated ceramic material to deposit on the workpiece; and
    axially advancing and rotating said rod along and about its longitudinal axis so as to feed said tip of said rod into said energy beam, to evaporate said ceramic material therefrom so that said evaporated ceramic material deposits on said workpiece; and
    feeding said tip of said rod into said energy beam at a rate responsive to a rate of deposition of said evaporated material on said workpiece so that a uniform rate of ceramic deposition occurs on said workpiece.

2. A process as claimed in claim 1, wherein a plurality of said ceramic rods may be supported with their tips pointing toward said energy beam, said ceramic rods being selectively fed one by one in succession into said energy beam, thereby forming a plurality of layers of the evaporated ceramic materials on the workpiece.

3. A process as claimed in claim 2, wherein said energy beam is a laser beam.

4. A process as claimed in claim 3, wherein said laser beam is a $CO_2$ laser.

5. A process as claimed in claim 3, wherein said laser beam is a YAG laser.

6. A process as claimed in claim 2, wherein said energy beam is an electron beam.

7. A process as claimed in claim 2, wherein said ceramic rods extend radially about said energy beam in a plane perpendicular to said energy beam.

8. A process as claimed in claim 2, wherein said ceramic rods are of different ceramic material.

* * * * *